United States Patent [19]

Shirai et al.

[11] 4,243,474

[45] Jan. 6, 1981

[54] PROCESS OF PRODUCING A PRINTED WIRING BOARD

[75] Inventors: Haruo Shirai; Yoshikatsu Tanaka, both of Kyoto; Zinzo Kosuga; Kiyoshi Osaka, both of Hikone, all of Japan

[73] Assignees: Shin-Kobe, Electric Machinery Co., Ltd., Tokyo; Shirai Denshi Kogyo Co., Ltd., Kyoto, both of Japan

[21] Appl. No.: 23,883

[22] Filed: Mar. 26, 1979

[30] Foreign Application Priority Data

Mar. 28, 1978 [JP] Japan .................................. 53-35689

[51] Int. Cl.³ .................. B44C 1/22; C03C 15/00; C03C 25/06; C23F 1/02
[52] U.S. Cl. ..................................... 156/630; 29/847; 156/150; 156/252; 156/634; 156/902; 174/68.5; 204/15; 204/24; 427/97; 428/902
[58] Field of Search .............. 174/68.5; 156/629-634, 156/656, 901, 902, 150, 151, 659, 659.1, 661.1, 252, 253; 428/902; 29/625; 427/96-97; 204/15, 24; 96/36.2

[56] References Cited

U.S. PATENT DOCUMENTS

| | | | |
|---|---|---|---|
| 3,436,819 | 4/1969 | Lunine | 29/625 X |
| 3,471,631 | 10/1969 | Quintana | 29/625 X |
| 3,566,005 | 2/1971 | Shaheen | 29/625 X |

Primary Examiner—William A. Powell
Attorney, Agent, or Firm—Pearne, Gordon, Sessions, McCoy & Granger

[57] ABSTRACT

This invention relates to a process of producing a printed wiring board having first and second electrically conductive circuit layers provided on an insulating laminate. The insulating laminate includes a first insulating layer having metal foils provided on both sides thereof and a second insulating layer which is attached to one of the sides of the first insulating layer so as to place one of the electrically conductive circuit layers between the first and second insulating layers. The first electrically conductive circuit layer is formed in a predetermined pattern by printing and etching one of the metal foils. Then, connecting through-holes are formed in the first insulating layer across the first electrically conductive circuit layer and the remaining metal foil. The second insulating layer is attached onto the first insulating layer so that the first electrically conductive circuit layer is covered with the second insulating layer. Thereafter the second electrically conductive circuit layer is formed in a predetermined pattern from the remaining metal foil by printing and etching.

10 Claims, 8 Drawing Figures

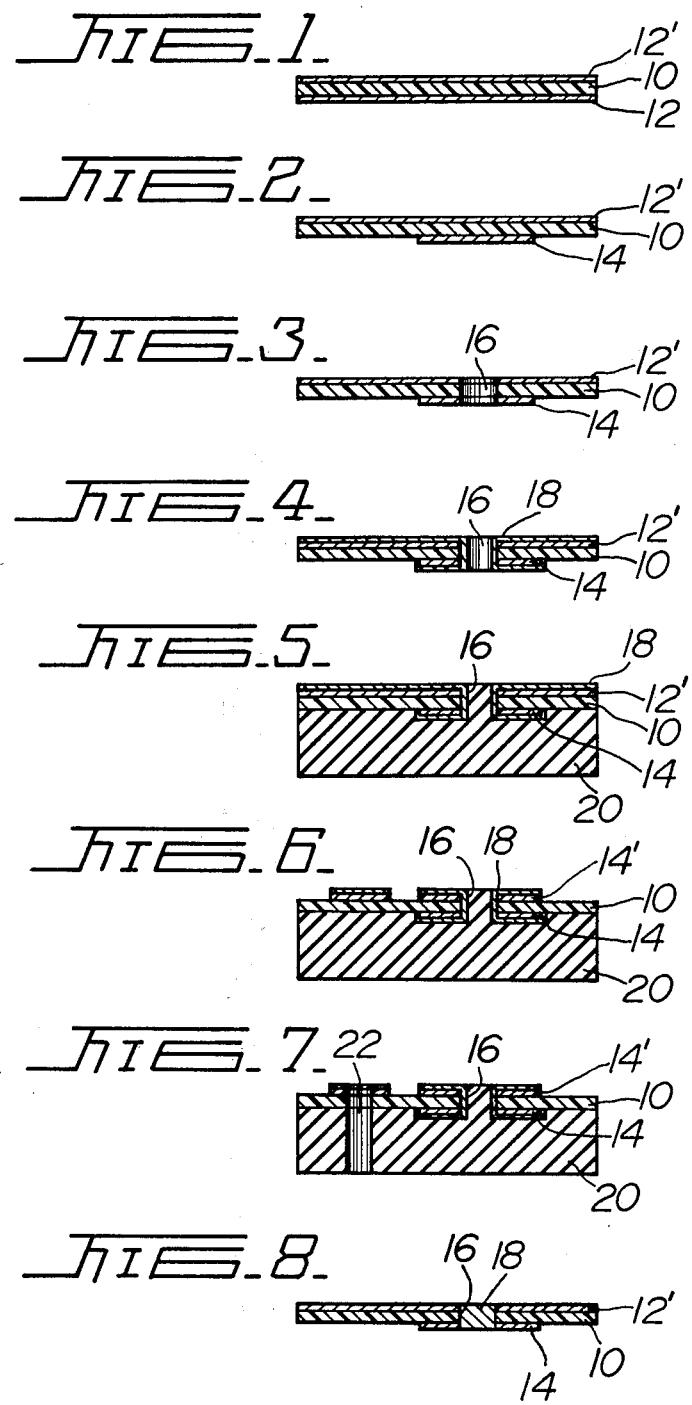

PROCESS OF PRODUCING A PRINTED WIRING BOARD

BACKGROUND OF THE INVENTION

In general, there are two types of printed wiring board used for application to the livelihood instruments such as televisions, radios, tape recorders, stereo instruments, precise devices such as cameras, watches and metering instruments, and other electro and electronic devices. One of the printed wiring boards is a one-side printed wiring board having an electrically conductive circuit layer provided on one of the sides of an insulating laminate. Another is a two-sided printed wiring board having two electrically conductive circuit layers provided one on each side of an insulating laminate and through-holes provided thereacross.

The one-side printed wiring board has been normally produced by printing, in a predetermined pattern, an etching resist on a copper foil on a one-side copper foiled insulating laminate, then etching that portion of the copper foil uncovered by the etching resist and thereafter removing the etching resist from the residual copper foil whereby a predetermined electrically conductive circuit layer is formed.

The two-sided printed wiring board has been normally produced in a manner as follows; through-holes are formed in a two-sided copper foiled insulating laminate; and then electroless copper and electrical copper plating layers are formed on the walls of the through-holes so as to permit the copper foils to be electrically connected by the plating layers. Thereafter, plating resists are painted on the copper foils in a pattern reverse to a predetermined pattern, and those portions of the copper foils uncovered by the plating resists are plated with electrical solder plating layer. Then, the plating resists are removed from the residual copper foils, after which the copper plating layers on the wall of the through-holes and the residual copper foils are etched with the electrical solder plating layer as etching resists.

As noted from the foregoing, the one-side printed wiring board can be inexpensively massproduced because its manufacturing process is simple, and easily assembled because of its having an electrically conductive circuit layer provided on one side thereof. However, it cannot advantageously follow the requirement of smaller scale, higher performance and higher density of instruments which is accompanyed by a recent rapid development of the electronic or electric instruments. The one-side printed wiring board cannot be applied for the instruments having a high density of components included therein.

The two-sided printed wiring board can be applied for such high density instruments, but it fails to be inexpensively mass-produced because its manufacturing process is complicated, and in addition thereto, in order to produce such wiring board of high reliance, insulating layers of epoxy resin impregnated woven glass fiber laminate are to be used in view of lower heat expansion of the insulating layers, while electrically conductive copper plating layers are to have the thickness of more than 25 micron.

As the requirement of higher density of components increases, even the two-sided through-hole type printed wiring board cannot be applied for such requirement. Furthermore, there have to be solved various problems such as complicated assembly which is caused by the electrically conductive circuit layers provided on both sides of the board and electrically insulating treatment after its assembly.

SUMMARY OF THE INVENTION

Accordingly, it is a principal object of the invention to provide a process of producing a printed wiring board having two electrically conductive circuit layers which can be less expensively manufactured in mass-production.

It is another object of the invention to provide a process of producing a printed wiring board having higher reliance of electrical conduction even though the electrically insulating layers have high expansion and contraction by heat.

In accordance with the invention, there is provided a process of producing a printed wiring board having two electrically conductive circuit layers on an insulating laminate, said process comprising the steps of preparing a first insulating layer having metal foils provided on both sides of said first insulating layer; forming a first electrically conductive circuit layer of predetermined pattern by treating one of said metal foils by printing and etching; forming connecting through-holes in said first insulating layer for connecting said first electrically conductive circuit layer and the other metal foil to each other; providing an electrically conductive member in said connecting through-holes so as to connect said first electrically conductive circuit layer and said other metal foil; attaching a second insulating layer to said first insulating layer so as to cover said first electrically conductive circuit layer whereby said insulating laminate is formed; and thereafter forming a second electrically conductive circuit layer of predetermined pattern by treating said other metal foil by printing and etching.

BRIEF DESCRIPTION OF THE DRAWING

The above and other objects and features of the invention will be apparent from the description of the embodiments taken with reference to the accompanying drawing in which;

FIG. 1 is a cross sectional view of a first insulating layer having metal foils provided on both sides thereof;

FIG. 2 is a cross sectional view of the first insulating layer after one of the metal foils is treated so as to form a first electrically conductive circuit layer by printing and etching;

FIG. 3 is a cross sectional view of the first insulating layer of FIG. 2 after through-holes are formed in the first insulating layer, the first electrically conductive circuit layer and the other metal foil;

FIG. 4 schematically illustrates an electrically conductive member provided in the through-holes and on the first electrically conductive circuit layer and the other metal foil;

FIG. 5 sectionally illustrates a second insulating layer attached to the first insulating layer of FIG. 4;

FIG. 6 is a cross sectional view of the board of FIG. 5 after the other metal foil is treated so as to form a second electrically conductive circuit layer by printing and etching;

FIG. 7 is a cross sectional view of a printed wiring board produced in accordance with the invention;

and FIG. 8 is similar to FIG. 4, but illustrates an alternative electrically conductive member provided in the through-holes and on the first electrically conductive circuit layer and the other metal layer.

DETAILED DESCRIPTION OF THE EMBODIMENTS

Referring now to FIG. 1, there is shown a first insulating layer 10 having metal foils 12 and 12' such as copper, nickel foils and the like provided on both sides of the first insulating layer 10. The first insulating layer 10 may be composed either of a laminate including a substrate layer of paper, cloth or glass cloth impregnated with thermosetting resins such as phenol, epoxy or polyester, or of a film or sheet of polyester, polyimide or polyamidoimide impregnated with such resins. It may preferably have the thickness of less than half of that of the final product, and most preferably have the thickness of 0.01 to 0.5 mm. The metal foils may have the thickness of 5 to 100 micron.

One of the metal foils 12', that is the metal foil 12 is treated by a common process of printing and etching to form a first or lower metal foil circuit layer 14 having the form of predetermined pattern as shown in FIG. 2.

Thereafter, as shown in FIG. 3, through-holes 16, only one of which is shown in this figure, are formed in the first insulating layer 10 by drilling or punching. The through-holes 16 serve to place an electrically conductive member therein to connect the first electrically conductive circuit layer 14 and the other metal foil 12' as described hereinjustbelow.

Next, as shown in FIG. 4, electrically conductive members 18 are placed in the through-holes 16 and on the first electrically conductive circuit layer 14 and the other metal foil 12' so as to electrically connect them. In the illustrated embodiment, the electrically conductive members 18 may comprise a metal layer which may be formed on the wall of the through-holes 16 as well as on the electrically conductive circuit layer 14 and the metal foil 12' by electroless copper plating after the walls of the through-holes 16 may be treated conventionally and preferably in addition thereto, by electrical copper plating.

Alternatively, as shown in FIG. 8, it may be applied either by rolling a melted solder so as to forcely insert it into the through-holes 16 or by filling an electrically conductive paint into the through-holes 16 by means of a conventional screen printing method. Since the first insulating layer 10 may have the thickness of 0.01 to 0.5 mm as aforementioned, the electrically conductive members 18 can be positively applied by such methods to the walls of the through-holes 16 so as to electrically connect the first electrically conductive circuit layer 14 and tha other foil 12' to each other.

After connecting the first electrically conductive circuit layer 14 and the metal foil 12' to each other in this manner, a second insulating layer 20 is attached to the first insulating layer 10 on the side of the first electrically conductive circuit layer 14 so as to cover it as shown in FIG. 5. The first and second insulating layers 10 and 20 form an insulating laminate of predetermined thickness as a whole. Thus, it will be noted that the whole insulating laminate has the thickness enough to provide a physical strength thereto and that various devices can be mounted thereon. The second insulating layer 20 may be composed of a commercially available thermo-setting resin impregnated laminate of predetermined thickness which comprises thermally and forcefully laminated substrate layers of paper, cloth or glass cloth impregnated with thermo-setting resin such as phenol, epoxy or polyester. The second insulating layer 20 may be formed by heating and pressurizing the resin impregnated layers together with the first insulating layer 10 on which the resin impregnated layers are placed. It will be noted that the second insulating layer is not necessarily required to be formed of the same material as that of the first insulating layer. In order to improve the bonding strength of the second insulating layer 20 with the electrically conductive member 18, an electroless plating layer or adhesive layer may be provided on the electrically conductive member 18, if necessary.

Finally, the metal foil 12' and the electrically conductive member 18 provided thereon are treated by printing and etching to remove unnecessary portions of them in a conventional manner so as to form a second electrically conductive circuit layer 14' of predetermined pattern as shown in FIG. 6.

Through-holes 22 may be formed by drilling or punching through the first and second insulating layers 10 and 20 across the second electrically conductive circuit layer 14'. The through-holes 22 serve to mount the electric or electronic devices such as resistors, capacitors and transistors.

It should be understood that one of the electrically conductive circuit layers 14 and 14' formed before bonding of the second insulating layer 20 to the first insulating layer 10 and another electrically conductive circuit layer 14' on the opposite side of the second insulating layer 20 formed after bonding of the second insulating layer 20 prevents the displacement of the electrically conductive circuit layers 14 and 14' and of breakage of the electrically conductive member 18 in the through-holes 16, which otherwise tends to occur during the laminating and bonding operation of the second insulating layer 20.

It should be also understood that since the electrically insulating layer 20 is bonded to the first insulating layer 10 after provision of the electrically conductive member 18 for connection of the first and second electrically conductive circuit layers 14 and 14', the through-holes are fully filled with materials of the second insulating layer 20 as shown in FIGS. 5 to 7. This prevents breakage of the electrically conductive member 18 which tends to occur due to expansion and contraction of the electrically insulating layers 10 and 20.

Some examples of the invention will be described hereinjustbelow.

EXAMPLE I

A first insulating layer of phenol resin impregnated paper substrate of 0.2 mm thickness having copper foils 12, 12' adhered thereto was prepared and treated so that a first electrically conductive circuit layer 14 of predetermined wiring pattern was formed by treating one of the metal foils by printing and etching in a conventional manner. Connecting through-holes 16 were then formed in the first insulating layer by drilling, and activated at the wall portion thereof. Thereafter, the first insulating layer having the first electrically conductive circuit layer and the other copper foil was immersed in an electroless copper plating solution to deposit copper on the wall portion of the through-holes, the first electrically conductive circuit layer and the other copper foil. Then, it was immersed in a copper sulfate plating solution and an electrical copper plating was effected by flowing a current of density of 2 A/dm$^2$ for 15 minutes to deposit an electrically conductive member 18 of copper plating layer of 15 micron thickness. The thus produced through-hole type board was immersed in an electroless tin plating solution for 30 seconds after being treated with acid, to form a tin plating layer having the thickness of 0.2 to 0.5 micron.

Then, modified phenol resin was applied on the whole surface of the through-hole type board on the side having the first electrically conductive circuit layer 14, after which an adhesive layer of 20 micron was provided on the phenol resin layer. A laminate 20 composed of paper substrate layer impregnated with phenol resin so as to have the thickness of 1.4 mm was placed on the adhesive side of the through-hole board in a press and heated and pressurized by the press under the conditions of a temperature of 170° C. and of a pressure of 50 Kg/cm² so as to produce a semi-finished board having the thickness of 1.6 mm and having the first electrically conductive circuit layer 14 placed between the first and second insulating layers 10 and 20 respectively, the latter of which was the laminate of phenol resin impregnated paper.

Finally, the copper plating layer and the other metal foil 12′ were treated by a conventional process to remove the unnecessary portion of them to form a second electrically conductive circuit layer 14′.

EXAMPLE II

A first insulating layer 10 of epoxy resin impregnated glass cloth substrate of 0.2 mm thickness having copper foils stuck 12, 12′ adhered thereto was used in place of the first insulating layer of Example I. A printed wiring board having two electrically conductive circuit layers 14, 14′, one of which was placed between the first and second insulating layers 10 and 20 respectively, was produced in a manner substantially identical to that of Example I.

EXAMPLE III

A first insulating layer 10 of epoxy resin impregnated glass cloth substrate of 0.2 mm thickness having copper foils stuck 12, 12′ adhered thereto was prepared and treated so that a first electrically conductive circuit layer 14 of predetermined wiring pattern was formed by treating one of the copper foils by printing and etching in a conventional manner. Connecting through-holes 16 were then formed in the first insulating layer by drilling, and activated at the wall portion thereof. Thereafter, the first insulating layer 10 having the first electrically conductive circuit layer 14 and the other copper foil 12 was immersed in an electroless plating solution so as to deposit an electrically conductive member 18 of copper on the wall of the connecting through-holes. Further, an electrical copper plating was effected by flowing a current of density of 2 A/dm² for 15 minutes through the copper sulfate plating solution to form a copper plating layer of 15 micron.

Then, a laminate 20 composed of glass cloth substrate layer impregnated with epoxy resin so as to have the thickness of 1.4 mm was placed on the pattern 14 side of the through-hole type board in a press, and heated and pressurized by the press under the conditions of a temperature of 170° C. and of a pressure of 50 Kg/cm² to produce a semi-finished board having the whole thickness of 1.6 mm and having the first electrically conductive circuit layer 14 placed between the first and second insulating layers 10 and 20, respectively the latter of which was the laminate of epoxy resin impregnated glass cloth.

Finally, the copper plating layer and the other copper foil 12′ were treated by a conventional process to remove the unnecessary portions of them to form a second electrically conductive circuit layer 14′.

Thus, the printed wiring board was produced having one of the electrically conductive circuit layers 14 placed between the first and second insulating layers 10 and 20, respectively.

EXAMPLE IV

A first insulating layer of polyester film having copper foils 12, 12′ of 100 micron adhered to both sides thereof was used in place of the first insulating layer of Example III. A printed wiring board having two electrically conductive circuit layers 14, 14′, one, 14, of which was placed between the first and second insulating layers 10 and 20, respectively, was produced in a manner substantially identical to that of Example III.

The printed wiring boards produced by Examples I, II, III and IV were subjected to a number of cycles of a thermal shock test, at each cycle of which they were steeped in an oil bath of 260° C. to 270° C. for five seconds and then in flowing water of 18° C. to 20° C. for twenty seconds. The results of the tests are shown in the following Table. To compare the results of the tests with those of the prior art, printed wiring boards having phenol resin impregnated paper substrate of 1.6 mm thickness and epoxy resin impregnated glass cloth substrate of 1.6 mm thickness were also used, respectively (Comparisons I and II).

TABLE

| Example or Comparison | Numbers of cycle at which no change was shown at the thermal shock test |
|---|---|
| Example I | 100 cycles |
| Example II | 150 cycles |
| Example III | 150 cycles |
| Example IV | 100 cycles |
| Comparison I | 30 cycles |
| Comparison II | 100 cycles |

As noted from the Table, the printed wiring boards produced in accordance with the invention have an excellent and reliable conductivity. It will be noted that the printed wiring board of the present invention, even in case of having Example I using a laminate of phenol resin impregnated paper substrate layer, has the fully reliable conductivity, which has never been shown in the prior art. It should be understood that the printed wiring board of the invention can have a reliable conductivity if it has the relatively thin electrically conductive member 18 of more than 15 micron thickness, which thin member 18 causes the process of producing the board to be simplified. In the prior art, it was necessary to have an electrically conductive member in the through holes of more than 25 micron thickness in order to provide a reliable conductivity thereto, which causes the process of producing the board to be more complicated. Thus, it will be noted that the printed wiring board of the invention can be mass-produced in an inexpensive manner.

It has been confirmed that the printed wiring board of the invention has an excellent physical property such as soldering resistance, heat resistance, humidity resistance, peeling strength, and water absorption, and also has an excellent electrical property such as insulation resistance, breakdown voltage, and surface and volume resistance.

It will be noted that since the printed wiring board of the invention has only one of the electrically conductive circuit layers exposed and the other electrically conductive circuit layer placed between the first and second insulating layers of the laminate, the density of wiring and of components can be much improved. Thus, it will be also noted that it can be suitable for a printed wiring board of bonding various chip elements.

Although some embodiments of the invention have been described with reference to the accompanying drawing, it will be understood to those skilled in the art that they are by way of example, and that various changes and modifications may be made without departing from the spirit and scope of the invention, which is intended to be defined only by the appended claims.

What is claimed is:

1. A process of producing a printed wiring board having two electrically conductive circuit layers provided on an insulating laminate, said process comprising the steps of;
    preparing a first insulating layer having a metal foil provided on each side of said first insulating layer;
    forming a first electrically conductive circuit layer of predetermined pattern by treating one of said metal foils by printing and etching;
    forming connecting through-holes in said first insulating layer for connecting said first electrically conductive circuit layer and the other metal foil to each other;
    providing an electrically conductive member in said connecting through-holes so as to connect said first electrically conductive circuit layer and said other metal foil;
    attaching a second insulating layer by heat and pressure to said first insulating layer so as to cover said first electrically conductive circuit layer whereby said insulating laminate is formed; and
    thereafter forming a second electrically conductive circuit layer of predetermined pattern by treating said other metal foil by printing and etching.

2. A process of producing a printed wiring board as set forth in claim 1, and wherein said step of providing an electrically conductive member in said connecting through-holes is accomplished by applying an electroless metal plating layer on the wall of said through-holes.

3. A process of producing a printed wiring board as set forth in claim 2, and wherein said step of providing an electrically conductive member in said connecting throughholes further includes applying an electrical metal plating layer on said electroless metal plating layer.

4. A process of producing a printed wiring board as set forth in claim 1, and wherein said step of providing an electrically conductive member is accomplished by forcing a melted solder into said connecting through-holes by rolling.

5. A process of producing a printed wiring board as set forth in claim 1, and wherein said step of providing an electrically conductive member in said connecting through-holes is accomplished by forcing an electrically conductive paint into said connecting through-holes by screen printing.

6. A process of producing a printed wiring board as set forth in claim 1, and wherein said step of attaching a second insulating layer to said first insulating layer is accomplished by heating and pressurizing a multi-ply thermosetting resin impregnated sheet material as said second insulating layer together with said first insulating layer.

7. A process of producing a printed wiring board as set forth in claim 1, and wherein said step of attaching a second insulating layer to said first insulating layer is accomplished by heating and pressurizing a multi-ply thermosetting resin impregnated sheet material as said second insulating layer together with a plastic film as said first insulating layer.

8. A process of producing a printed wiring board as set forth in claim 1, wherein the step of heat and pressure attaching of said first and second insulating layers fills the through-holes with insulating material of the second insulating layer.

9. A process of producing a printed wiring board as set forth in claim 1, wherein the electrically conductive member in said through-holes is in the range of fifteen to twenty-five microns thickness.

10. A process of producing a printed wiring board as set forth in claim 1, including the subsequent step of producing second through-holes through the first and second insulating layers.

* * * * *

UNITED STATES PATENT AND TRADEMARK OFFICE
CERTIFICATE OF CORRECTION

PATENT NO. : 4,243,474

DATED : January 6, 1981

INVENTOR(S) : Haruo Shirai et al.

It is certified that error appears in the above—identified patent and that said Letters Patent is hereby corrected as shown below:

Column 5, lines 28 and 39, delete "stuck".

Signed and Sealed this

Twelfth Day of May 1981

[SEAL]

Attest:

RENE D. TEGTMEYER

Attesting Officer     Acting Commissioner of Patents and Trademarks